United States Patent
Fan

(10) Patent No.: US 8,161,424 B2
(45) Date of Patent: Apr. 17, 2012

(54) METHOD AND APPARATUS FOR MODELING CHEMICALLY AMPLIFIED RESISTS

(75) Inventor: Yongfa Fan, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 359 days.

(21) Appl. No.: 12/510,503

(22) Filed: Jul. 28, 2009

(65) Prior Publication Data

US 2011/0029118 A1    Feb. 3, 2011

(51) Int. Cl.
G06F 17/50 (2006.01)
G06F 19/00 (2006.01)
G06F 17/17 (2006.01)
G06F 7/58 (2006.01)
H01L 21/00 (2006.01)
H01L 21/302 (2006.01)

(52) U.S. Cl. .................. 716/53; 716/54; 716/55; 703/2; 703/12; 703/14; 700/97; 700/119; 700/121; 438/238; 438/689; 438/8

(58) Field of Classification Search .................. 716/53, 716/54, 55; 703/2, 12, 14; 700/97, 119, 700/121; 438/238, 689, 8
See application file for complete search history.

(56) References Cited

U.S. PATENT DOCUMENTS

| | | | | |
|---|---|---|---|---|
| 4,518,456 A | * | 5/1985 | Bjorkholm | 438/8 |
| 5,041,397 A | * | 8/1991 | Kim et al. | 438/784 |
| 6,200,822 B1 | * | 3/2001 | Becker et al. | 438/9 |
| 6,858,537 B2 | * | 2/2005 | Brewer | 438/692 |

* cited by examiner

Primary Examiner — Phallaka Kik
(74) Attorney, Agent, or Firm — Park, Vaughan, Fleming & Dowler LLP; Laxman Sahasrabuddhe

(57) ABSTRACT

Some embodiments provide a system for accurately and efficiently modeling chemically amplified resist. During operation, the system can determine a quenched acid profile from an initial acid profile by applying multiple quenching models which are associated with different acid concentration ranges to the initial acid profile. One quenching model may be expressed as $H = H_0 - B_0$, where H is an acid profile after quenching, $H_0$ is an acid profile before quenching, and $B_0$ is an initial base quencher profile. Another quenching model may be expressed as $H = k \cdot H_0$, where k is a constant. Next, the system can apply a smoothing kernel to the quenched acid profile to obtain a quenched-and-diffused acid profile. The smoothing kernel can generally be any weighted averaging function. The quenched-and-diffused acid profile can then be used to predict shapes that are expected to print on the wafer and to perform resolution enhancement techniques on a layout.

21 Claims, 7 Drawing Sheets

METHOD AND APPARATUS FOR MODELING CHEMICALLY AMPLIFIED RESISTS

BACKGROUND

1. Technical Field

The present invention relates to integrated circuit design and fabrication. More specifically, the present invention relates to methods and apparatuses for modeling chemically amplified resists.

2. Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

As semiconductor design enters the deep submicron era, process model accuracy and efficiency is becoming increasingly important. Inaccuracies in the process model negatively affect the efficacy of downstream applications. For example, inaccuracies in the photolithography process model can reduce the efficacy of optical proximity correction (OPC). If the process model is computationally inefficient, it can increase the time-to-market for an integrated circuit, which can cost millions of dollars in lost revenue. Hence, it is desirable to improve the accuracy and the efficiency of a process model.

SUMMARY

A process model needs to be very fast and accurate. Unfortunately, conventional techniques for modeling chemically amplified resist (CAR) are either slow or inaccurate, or both.

Some embodiments of the present invention provide systems and techniques for accurately and efficiently modeling CAR. An initial acid profile is typically determined using the aerial image intensity on the resist's surface. Note that the aerial image intensity can be determined by convolving a layout with an optical model. Next, the system can determine a quenched acid profile from the initial acid profile by applying multiple quenching models which are associated with different acid concentration ranges to the initial acid profile. In other words, some embodiments of the present invention accurately and efficiently model CAR by partitioning the total range of acid concentration into different ranges, and by using separate quenching models for the different acid concentration ranges.

The system can use a smoothing function to model diffusion of the acid. Specifically, the system can apply a smoothing kernel to the quenched acid profile to obtain a quenched-and-diffused acid profile.

The quenched-and-diffused acid profile can then be used to predict shapes that are expected to print on the wafer, e.g., by comparing the acid profile with a threshold. Further, the quenched-and-diffused acid profile can also be used to determine optical proximity corrections and/or assist feature placements in the layout.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
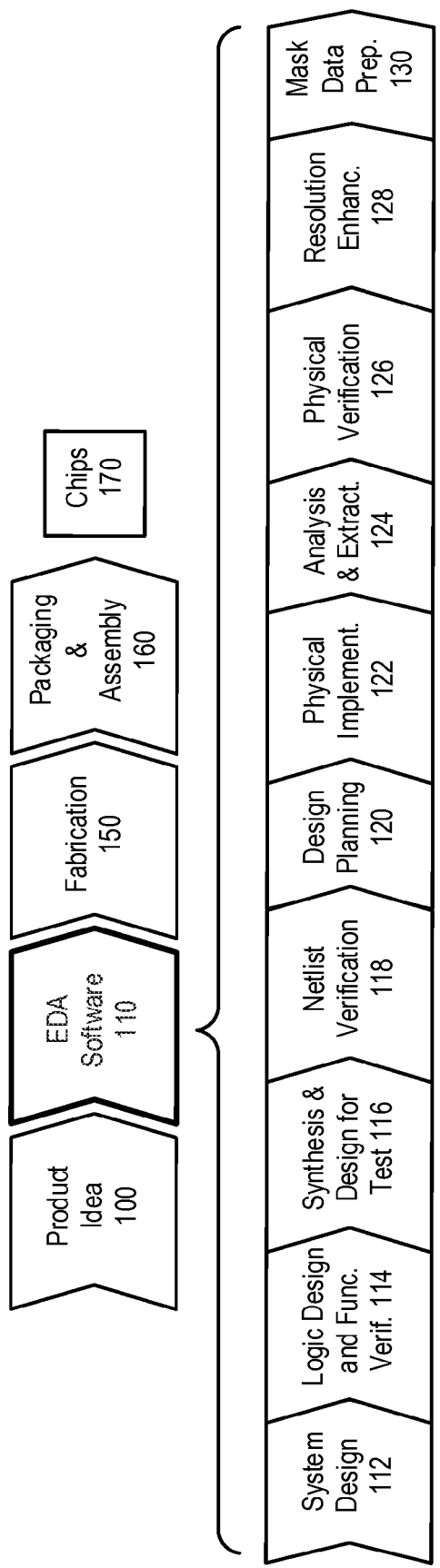
FIG. 1 illustrates various stages in the design and fabrication of an integrated circuit.

FIG. 1 illustrates various stages in the design and fabrication of an integrated circuit.

The process can start with a product idea (step 100) which can be realized using an integrated circuit that is designed using an EDA process (step 110). After the integrated circuit design is finalized, it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this step include Model Architect, Saber®, System Studio, and DesignWare®.

During logic design and functional verification (step 114), the VHDL or Verilog code for modules in the system can be written and the design can be checked for functional accuracy, e.g., the design can be checked to ensure that it produces the correct outputs. Exemplary EDA software products from Synopsys, Inc. that can be used at this step include VCS®, Vera®, DesignWare®, Magellan™, Formality®, ESP and Leda®.

During synthesis and design for test (step 116), the VHDL/Verilog can be translated to a netlist. Further, the netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

During netlist verification (step 118), the netlist can be checked for compliance with timing constraints and for correspondence with the VHDL/Verilog source code. Exemplary EDA software products from Synopsys, Inc. that can be used at this step include Formality®, PrimeTime®, and VCS®.

During design planning (step 120), an overall floorplan for the chip can be constructed and analyzed for timing and top-level routing. Exemplary EDA software products from Synopsys, Inc. that can be used at this step include Astro™ and IC Compiler products.

During physical implementation (step 122), circuit elements can be positioned in the layout (placement) and can be electrically coupled (routing). Exemplary EDA software products from Synopsys, Inc. that can be used at this step include Astro™ and IC Compiler products.

During analysis and extraction (step 124), the circuit's functionality can be verified at a transistor level and parasitics can be extracted. Exemplary EDA software products from Synopsys, Inc. that can be used at this step include AstroRail™, PrimeRail, PrimeTime®, and Star-RCXT™.

During physical verification (step 126), the design can be checked to ensure correctness for manufacturing, electrical issues, lithographic issues, and circuitry. Hercules™ is an exemplary EDA software product from Synopsys, Inc. that can be used at this step.

During resolution enhancement (step 128), geometric manipulations can be performed on the layout to improve manufacturability of the design. Exemplary EDA software products from Synopsys, Inc. that can be used at this step include Proteus/ProGen, ProteusAF, and PSMGen.

During mask data preparation (step 130), the design can be "taped-out" to produce masks which are used during fabrication.

Process Model

A process model models the behavior of one or more semiconductor manufacturing processes which typically involve complex physical and chemical interactions. A process model is usually determined by fitting kernel coefficients and/or parameters to empirical data. The empirical data is usually generated by applying the semiconductor manufacturing processes that are being modeled to one or more test layouts.

Figure 2:
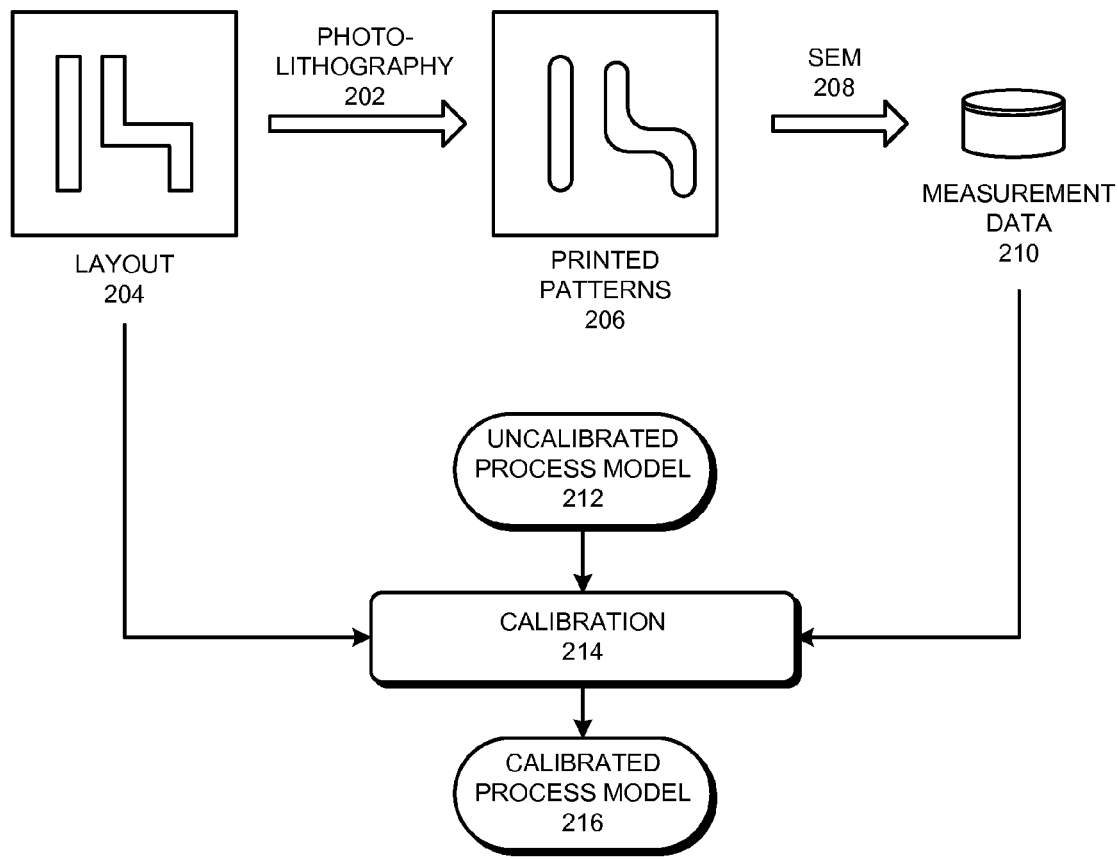
FIG. 2 illustrates how a process model can be determined using empirical data in accordance with an embodiment of the present invention.

FIG. 2 illustrates how a process model can be determined using empirical data in accordance with an embodiment of the present invention.

Photolithography process 202 can be used to print layout 204 on a wafer to obtain printed patterns 206. Next, a scanning electron microscope (SEM) 208 can be used to measure critical-dimensions (CDs) of printed patterns 206 to obtain measurement data 210. Note that the CD measurement is typically performed after one or more post-exposure processes, and the CD measurement data is sometimes referred to as process data or empirical data.

Next, the system can calibrate an uncalibrated process model using layout 204 and measurement data 210. Specifically, layout 204 and measurement data 210 be used to calibrate (block 214) uncalibrated process model 212 to obtain calibrated process model 216. Note that calibrated process model 216 models the behavior of photolithography process 202.

For example, uncalibrated process model 212 may be represented as $$\sum_i (C_i \cdot K_i),$$

where $K_i$ is a modeling function or kernel, and $C_i$ is a coefficient which is associated with $K_i$. The modeling function $K_i$ may also include parameters which are also fit during calibration. During calibration, the $C_i$ values and any parameter values may be determined by fitting them using layout 204 and measurement data 210.

Ideally, we may want to determine coefficient and/or parameter values which will cause the predicted data to exactly match the empirical data. However, an exact fit is usually not possible, and even if it is possible, it may not be desirable because the resulting process model may not interpolate and/or extrapolate properly. Hence, statistical fitting techniques are typically used to determine the parameters and/or coefficients so that the error between the empirical data and the predicted data is minimized. In one embodiment, the system can use a least-squares fitting technique to determine the parameter and/or coefficient values.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Once a process model is determined, it can be used in a number of applications during the design and manufacture of a semiconductor chip.

Figure 3:
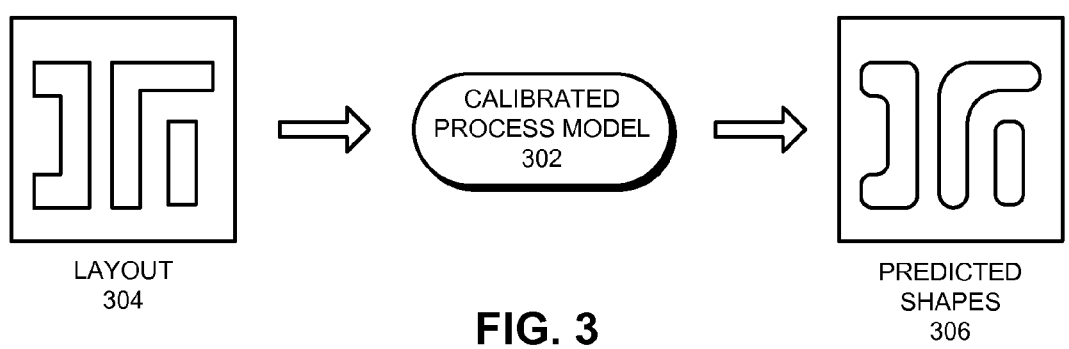
FIG. 3 illustrates how a process model can be used to predict shapes on the wafer in accordance with an embodiment of the present invention.

FIG. 3 illustrates how a process model can be used to predict shapes on the wafer in accordance with an embodiment of the present invention.

Calibrated process model 302 may be used to predict the shapes that are expected to be printed on the wafer. Specifically, calibrated process model 302 can take layout 304 as input and generate predicted shapes 306 as output. A user can view predicted shapes 306 to determine whether the design intent in layout 304 is expected to be manufactured properly.

Figure 4:
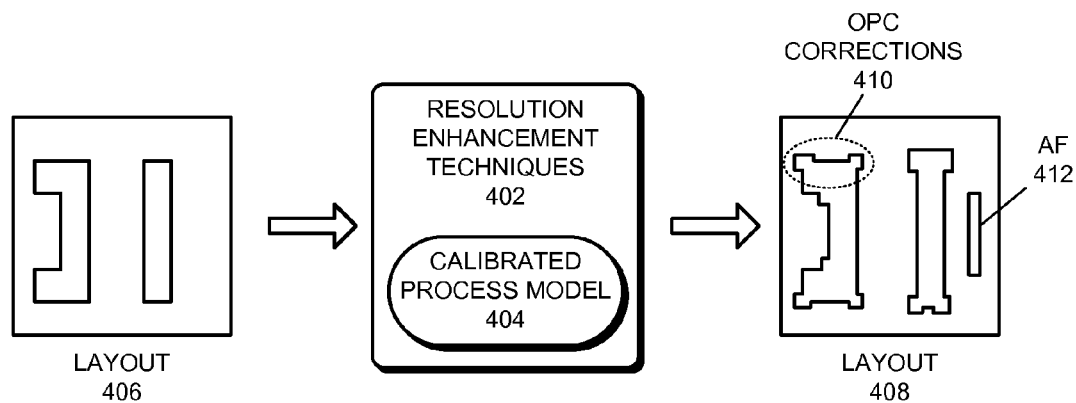
FIG. 4 illustrates how a process model can be used to support resolution enhancement techniques (RETs) in accordance with an embodiment of the present invention.

FIG. 4 illustrates how a process model can be used to support resolution enhancement techniques (RETs) in accordance with an embodiment of the present invention.

RETs 402 can use calibrated process model 404 to modify layout 406 to obtain layout 408, which is expected to eliminate or at least substantially reduce manufacturing problems. Specifically, calibrated process model 404 can be used to perform OPC corrections 410, and to place assist features (AFs), such as AF 412.

Chemically Amplified Resist and Base Quenching

Chemically amplified resists (CARs) have higher sensitivity to light. Hence, these resists can be used with photolithography processes that use low power light sources.

A two-stage process is typically used to change the solubility characteristics of a chemically amplified resist. In the first stage, the CAR is exposed to light, which causes a chemical reaction to occur in the CAR. The higher the aerial image intensity at a location on the CAR, the greater the reaction products that are produced at that location. In other words, the variation of the concentration of the reaction products across the CAR's surface corresponds to the aerial image. Note that, in typical CARs, the reaction products of the first stage are acidic in nature.

In the second stage, which is called the post-exposure bake stage, a thermally induced chemical reaction occurs in the CAR which changes the solubility of the CAR. The reaction products from the first stage act as a catalyst in the second stage. In other words, the reaction products from the first stage amplify the effects of the second stage, which is why such resists are called "chemically amplified" resists.

Since the acidic products that are generated in the first stage act as catalysts during the second stage, a small variation in the acid concentration can cause a disproportionately large effect during the second stage. Specifically, anime contamination can reduce the acid concentration on the surface of the resist, which can cause "T-topping" effects which are highly undesirable. To overcome the anime contamination problem, a base quencher can be used to intentionally neutralize some of the acid in the resist.

Figure 5:
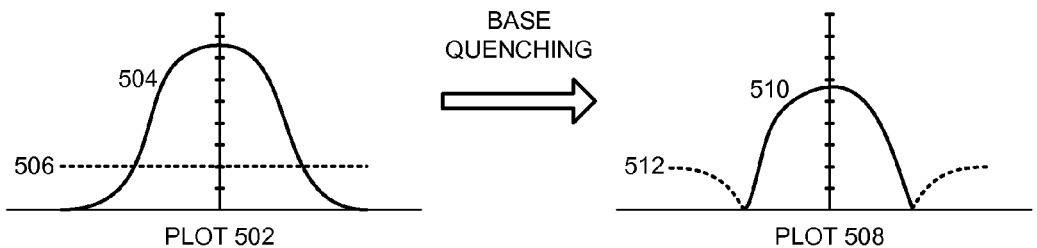
FIG. 5 illustrates the effect of adding a base quencher in accordance with an embodiment of the present invention.

FIG. 5 illustrates the effect of adding a base quencher in accordance with an embodiment of the present invention.

Curve 504 in plot 502 represents the variation in the acid concentration before a base quencher is added to the resist. Note that the two-dimensional variation of the acid concentration across the resist is also known as the acid profile. (Note that, although the acid profile is two-dimensional, it is illustrated as a one-dimensional curve in FIGS. 5, 6, 7, and 8 for the sake of clarity.)

Curve 506 in plot 502 represents the variation in the base quencher concentration. Curves 510 and 512 in plot 508 represent the acid profile and the base quencher profile after the base quenching reaction. As illustrated in plot 508, the base quencher has neutralized the acid in areas where the acid levels are lower than the base quencher levels.

Note that the anime contamination problem occurred in areas that had low acid levels. The base quenching approach overcomes the anime contamination problem by intentionally neutralizing low acid levels. In addition to solving the anime contamination problem, base quenching can enhance resist contrast and help control line edge roughness.

Unfortunately, base quenching also has some drawbacks. Since base quenching neutralizes the acidic catalyst, it reduces the photo speed and influences iso-focal points in the layout. Further, base quenching is a major contributor to non-linear resist behavior, which makes it very challenging to accurately and efficiently model chemically amplified resists.

The following partial differential equations describe how the acid and base levels change during post-exposure bake. The rate of change in the polymer concentration is proportional to the product of the acid concentration and the polymer concentration. Specifically, $$-\frac{\partial P}{\partial t} = k_r PH, \quad (1)$$

where P is the polymer concentration, H is the acid concentration, and $k_r$ is the polymer de-protection constant.

The acid concentration, H, and the base concentration, B, are related by the following equations:

$$\frac{\partial H}{\partial t} = -k_l HB + \nabla \cdot (D_H \nabla H) \quad (2)$$

$$\frac{\partial B}{\partial t} = -k_l HB + \nabla \cdot (D_B \nabla B). \quad (3)$$

In the above equations, $k_l$ is a constant that is associated with the acid-base neutralization reaction. The term $\nabla \cdot (D_H \nabla H)$ represents the diffusion of the acid, and the term $\nabla \cdot (D_B \nabla B)$ represents the diffusion of the base. $D_H$ and $D_B$ are the diffusivities of the acid and base, respectively, and are given by:

$$D_H = D_{H0} \exp(w_H \times P) \quad (4)$$

$$D_B = D_{B0} \exp(w_B \times P), \quad (5)$$

where $D_{H0}$ and $D_{B0}$ are the general diffusivity values, and $w_H$ and $w_B$ are constants.

The boundary conditions are:

$$H|_{t=0} = H_0(x,y) = 1 - \exp[-C \times dose \times I(x,y)] \quad (6)$$

$$B|_{t=0} = B_0, \quad (7)$$

which state that, at time t=0, the acid and base concentrations are equal to $H_0$ and $B_0$, respectively. As shown in Equation (6), the initial acid concentration $H_0$ can be determined based on the exposure dose, an empirical constant C, and the aerial image intensity I(x, y).

Figure 6:
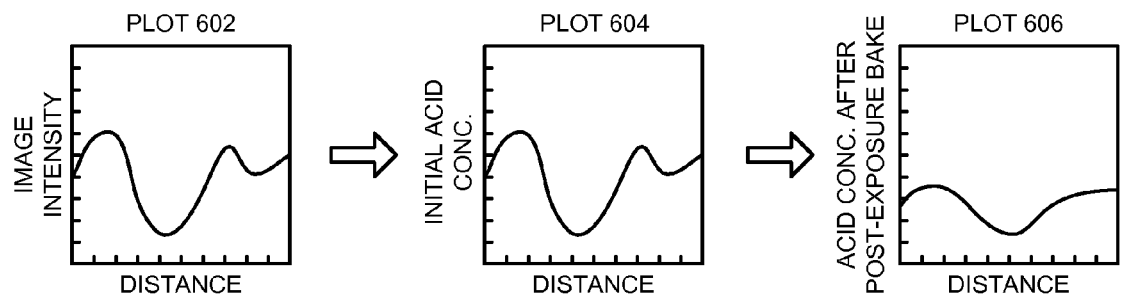
FIG. 6 illustrates the acid profile during post-exposure bake in accordance with an embodiment of the present invention.

FIG. 6 illustrates the acid profile during post-exposure bake in accordance with an embodiment of the present invention. Note that the plots shown in FIG. 6 are for illustration purposes only.

Plot 602 illustrates the variation of aerial image intensity on the resist's surface. Plot 604 illustrates the variation of the acid concentration immediately after exposure. Note that the image intensity curve shown in plot 602 is substantially similar to the acid profile shown in plot 604 (the initial acid profile shown in plot 604 is sometimes called the "latent image" for this reason). Plot 606 illustrates the acid profile after adding the base quencher, and performing the post-exposure bake process. Note that, due to the neutralization reaction and due to diffusion, the acid profile in plot 606 is different from the acid profile in plot 604.

Figure 7:
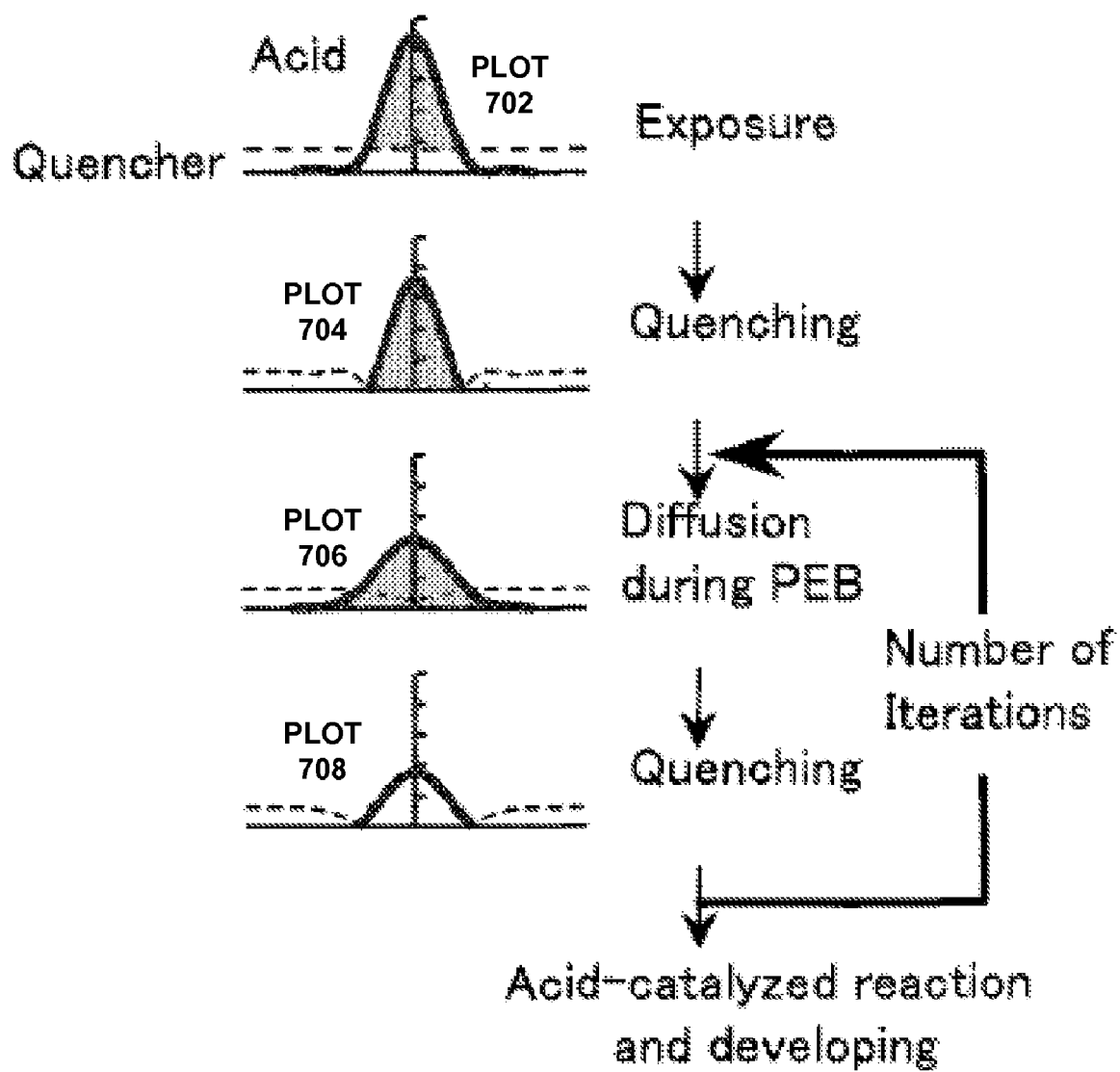
FIG. 7 illustrates a conventional technique for modeling a chemically amplified resist.

FIG. 7 illustrates a conventional technique for modeling a chemically amplified resist. Specifically, the technique illustrated in FIG. 7 is described in Keiko T. Hattori, Jun Abe, and Hiroshi Fukuda, "*Accuracy of simulation based on the acid-quencher mutual diffusion model in KrF processes*," Proc. SPIE, Vol. 4691, pp. 1243-53 (2002).

Acid and base concentration profiles after exposure are depicted in plot 702. The solid line represents the acid profile and the dashed line represents the base profile. The conventional technique uses the above-described partial differential equations to alternately simulate the base quenching reaction (i.e., the acid-base neutralization reaction) and the diffusion process. When the base quenching reaction is simulated, the technique ignores diffusion, i.e., the second terms in the right hand side of Equations (2) and (3) are ignored. Conversely, when the diffusion process is simulated, the technique ignores the base quenching reaction, i.e., the first terms in the right hand side of Equations (2) and (3) are ignored.

For example, the acid and base profiles shown in plot 704 are after the base quenching simulation is performed. Plot 706 illustrates the acid and base profiles after the diffusion process is simulated. Plot 708 illustrates the acid and base profiles after the base quenching simulation is performed on the acid and base profiles shown in plot 706. The diffusion process and the base quenching reaction are then alternately simulated for a number of iterations to obtain the final acid profiles. The final acid profile can then be used to predict shapes on the wafer.

Unfortunately, conventional techniques for modeling CAR are unsuitable for use in process models because the techniques are either inefficient, or inaccurate, or both. Hence, what is needed are systems and techniques to accurately and efficiently model CAR behavior.

Process for Accurately and Efficiently Modeling Chemically Amplified Resist

Note that Equation (2) can be simplified under the following assumptions: (a) quenching is independent of diffusion, and (b) the acid concentration or the base concentration is substantially greater than the other.

Specifically, if we assume that quenching is independent of diffusion, Equation (2) can be simplified to give:

$$\frac{dH}{dt} = -k_l HB. \tag{8}$$

If B≫ H, the base concentration, B, can be treated as a constant. If B is a constant, Equation (8) can be further simplified to give:

$$\frac{dH}{H} = -k_l B dt. \tag{9}$$

Solving for H in Equation (9), we get:

$$H = H_0 e^{k_l Bt}; \tag{10}$$

$$\frac{H}{H_0} = e^{-k_l Bt} = \text{constant}$$

In other words, under the B≫ H assumption, the acid concentration after base quenching is given by $H = k \cdot H_0$, where k is a constant which can be determined empirically, and $H_0$ is the initial acid concentration, i.e., the acid concentration at the beginning of the base quenching reaction.

On the other hand, if H≫ B, then the base can be assumed to be completely neutralized, and hence, the resulting acid concentration is given by:

$$H = H_0 - B_0, \tag{11}$$

where $H_0$ and $B_0$ are the initial acid and base concentrations, respectively.

Finally, if H≈B, the acid concentration can be approximated by taking a weighted average of the acid concentration values from Equations (10) and (11).

Some embodiments of the present invention use the above insights to provide techniques and systems for accurately and efficiently modeling CAR. Specifically, some embodiments determine a set of acid concentration ranges, and use different quenching models for each acid concentration range (e.g., different quenching models may be used for acid ranges that correspond to B≫ H and H≫ B). Next, a smoothing kernel can be applied to the acid profile to model diffusion of the acid and to model quenching in acid ranges that correspond to H≈B.

Figure 8:
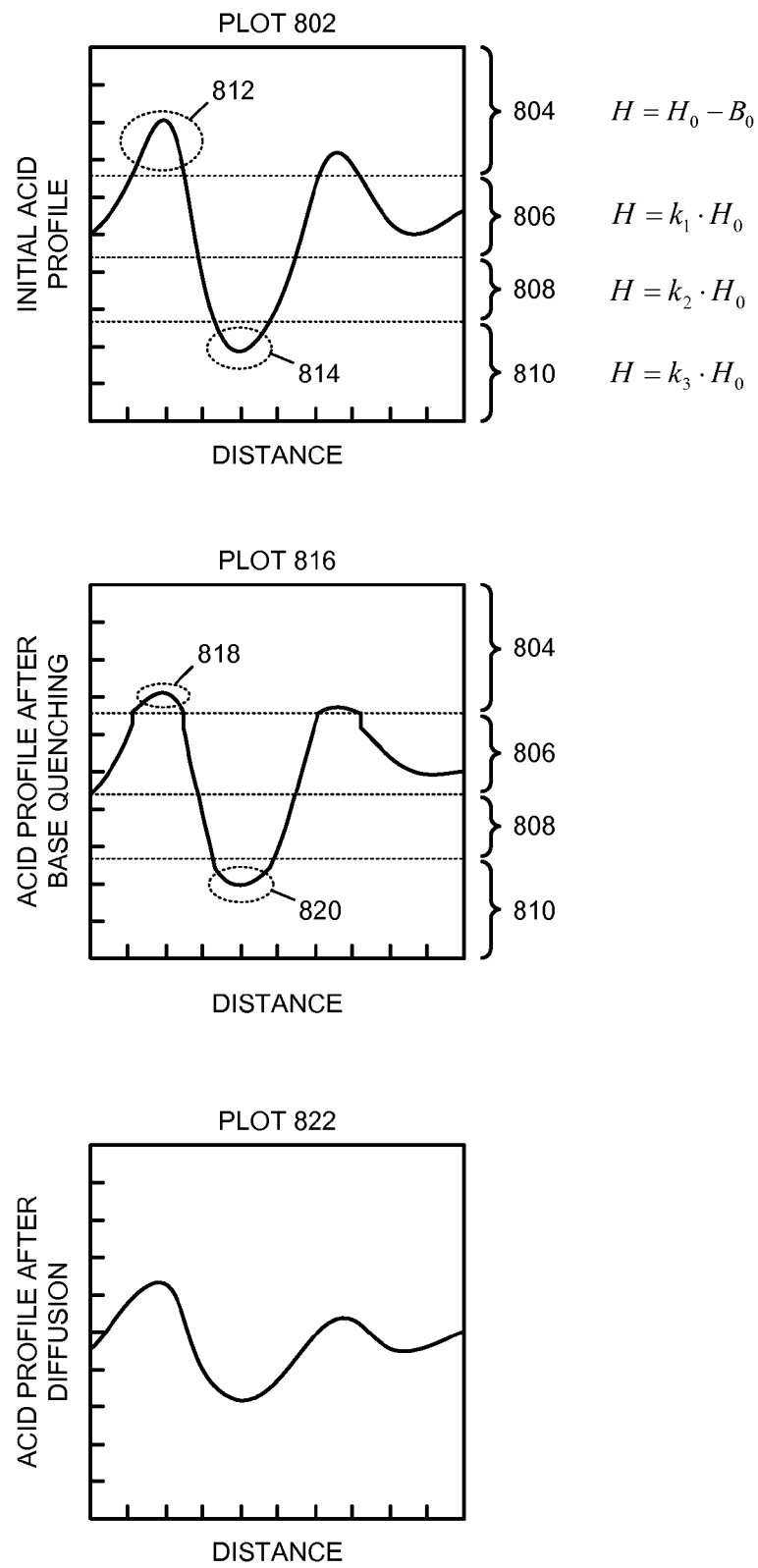
FIG. 8 illustrates a technique for accurately and efficiently modeling chemically amplified resist in accordance with an embodiment of the present invention.

FIG. 8 illustrates a technique for accurately and efficiently modeling chemically amplified resist in accordance with an embodiment of the present invention.

Plot 802 illustrates the initial acid profile. The user can define or the system can determine a set of acid concentration ranges. For example, plot 802 illustrates four acid concentration ranges, namely, 804, 806, 808, and 810.

Next, the system can use different models for each acid concentration range. For example, the highest acid concentration range can use a quenching model that corresponds to the H≫ B assumption, the lowest concentration range can use a quenching model that corresponds to the B≫ H assumption, and the other concentration ranges can use a quenching model that corresponds to the H≈ B assumption.

Specifically, as shown in FIG. 8, the system can use equation $H = H_0 - B_0$ for acid range 804, equation $H = k_1 \cdot H_0$ for acid range 806, equation $H = k_2 \cdot H_0$ for acid range 808, and $H = k_3 \cdot H_0$ for acid range 810. The constants $k_1$, $k_2$, and $k_3$ can be empirically determined, e.g., they can be fit to empirical data during model calibration.

Plot 816 illustrates the acid profile once these different models are applied to different acid ranges. Specifically, the H≫ B model is applied to the acid profile in region 812 to obtain the acid profile in region 818. On the other hand, the B≫ H model is applied to the acid profile in region 814 to obtain the acid profile in region 820. Since the system applies different base quenching models to different portions of the acid profile, the resulting acid profile may not be continuous, as shown in plot 816. These discontinuities in the acid profile are removed during the next stage which models diffusion.

The system can model diffusion by applying a smoothing function or kernel to the acid profile. For example, the system can apply a smoothing kernel to the acid profile shown in plot 816 to obtain the acid profile shown in plot 822. Note that the discontinuities that existed in plot 816 have been removed in plot 822.

A smoothing kernel can generally be any weighted averaging kernel. For example, the smoothing kernel can be a two-dimensional Gaussian kernel which can be expressed as:

$$G(x,y) = (1/2\pi\sigma^2) \cdot \exp(-(x^2+y^2)/2\sigma^2), \tag{12}$$

where σ is a constant that can be fit during model calibration. Other smoothing kernels that can be used include, but are not limited to, an Epanechnikov kernel and a triangular kernel. A normalized two-dimensional Epanechnikov kernel may be expressed in polar coordinates as:

$$E(r,\theta) = (2/\pi) \cdot (1-r^2), 0 \leq r \leq 1. \tag{13}$$

Recall that the quenched acid profile can be a two-dimensional function which describes the variation of the acid concentration across the resist. The system can apply the smoothing kernel to the quenched acid profile by convolving the smoothing kernel with the quenched acid profile.

The constants used in the quenching model and the smoothing kernel can be fit to empirical data during model calibration. For example, as shown in FIG. 2, uncalibrated process model 212 may specify the number of acid concentration ranges that are used in the quenching model. Next, during calibration 214, the system may use layout 204 and measurement data 210 to fit constants, such as, $k_1$, $k_2$, $k_3$, and σ. The fitted values of these constants can then be used in calibrated process model 216.

Figure 9:
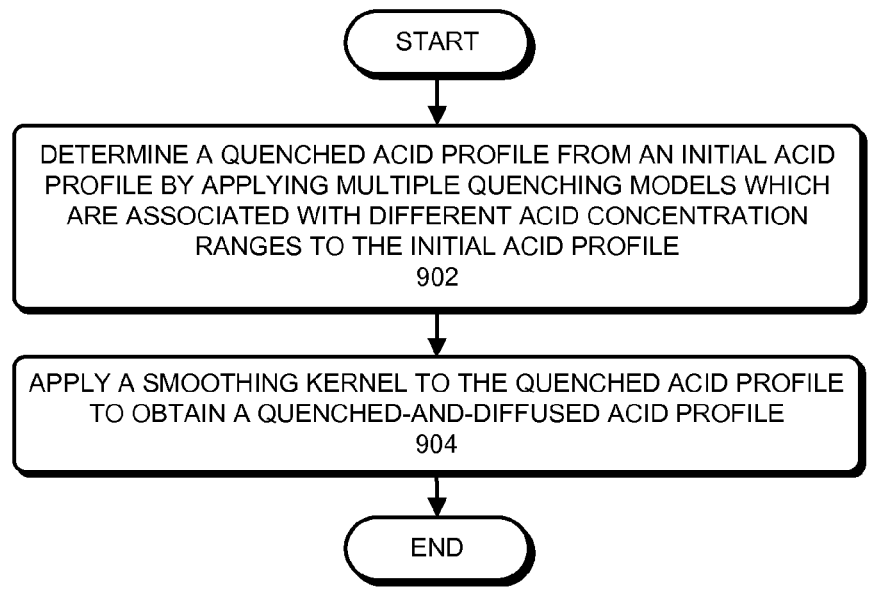
FIG. 9 presents a flowchart that illustrates a process for modeling chemically amplified resist in accordance with an embodiment of the present invention.

FIG. 9 presents a flowchart that illustrates a process for modeling chemically amplified resist in accordance with an embodiment of the present invention.

During operation, the system can determine a quenched acid profile from an initial acid profile by applying multiple quenching models which are associated with different acid concentration ranges to the initial acid profile (block 902).

Specifically, one of the quenching models can be expressed as $H = H_0 - B_0$, wherein H is an acid profile after quenching, $H_0$ is an acid profile before quenching, and $B_0$ is an initial base quencher profile. Another quenching model can be expressed as $H = k \cdot H_0$, where k is a constant which can be determined during process model calibration.

Next, the system can apply a smoothing kernel to the quenched acid profile to obtain a quenched-and-diffused acid profile (block 904).

The system can then use the quenched-and-diffused acid profile to predict shapes and sizes of features that are expected to print on the wafer. Alternatively, the system can use the quenched-and-diffused acid profile to determine proximity corrections to improve manufacturability of a layout.

Many variations and modifications of the process illustrated in FIG. 9 will be apparent to a skilled practitioner. For example, in some embodiments, the system may perform multiple iterations of the operations shown in blocks 902 and 904. In each iteration, the system may use a different set of quenching models. For example, during the first iteration, the system may use four quenching models, but in the next iteration, the system may use only two quenching models. Even if the system uses the same number of quenching models in each iteration, the values of the constants in the quenching models may differ from one iteration to the next.

Figure 10:
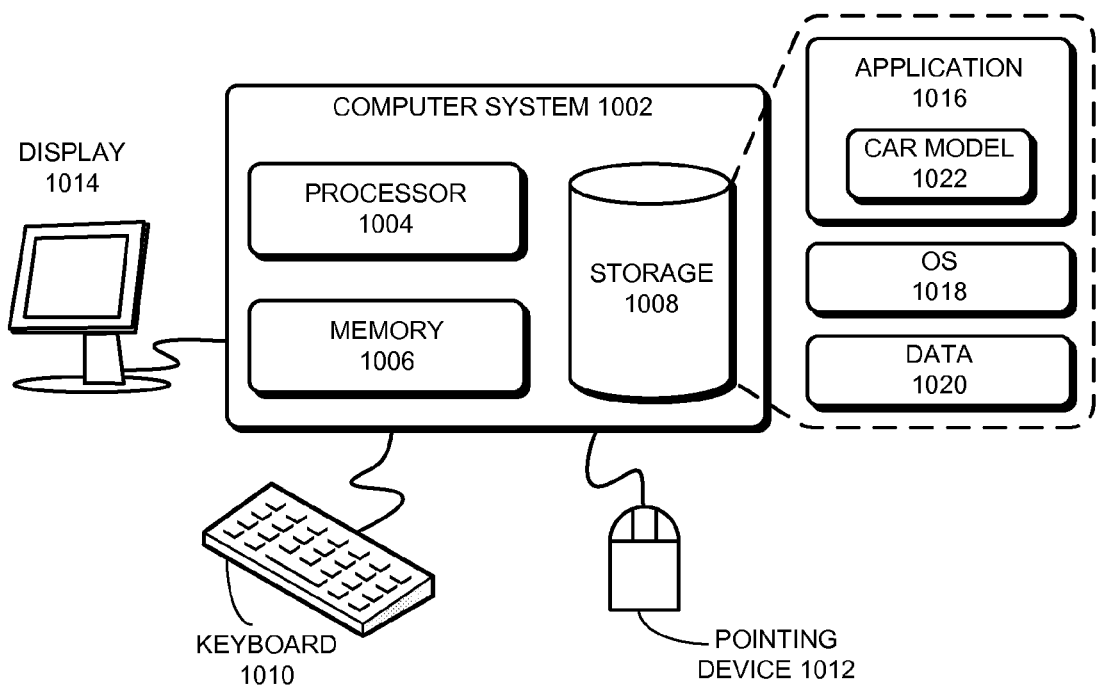
FIG. 10 illustrates a computer system in accordance with an embodiment of the present invention.

FIG. 10 illustrates a computer system in accordance with an embodiment of the present invention.

A computer system can generally be any system that can perform computations. Specifically, a computer system can be a microprocessor, a network processor, a portable computing device, a personal organizer, a device controller, or a computational engine within an appliance, or any other computing system now known or later developed. Computer system 1002 comprises processor 1004, memory 1006, and storage 1008. Computer system 1002 can be coupled with display 1014, keyboard 1010, and pointing device 1012. Storage 1008 can generally be any device that can store data. Specifically, a storage device can be a magnetic, an optical, or a magneto-optical storage device, or it can be based on flash memory and/or battery-backed up memory. Storage 1008 can store application 1016, operating system 1018, and data 1020. Application 1016 can include CAR model 1022.

Application 1016 can use resolution enhancement techniques to improve manufacturability of a layout. Specifically, application 1016 can use CAR model 1022 to perform OPC corrections on a layout and/or place assist features in the layout. Alternatively, application 1016 may use CAR model 1022 to predict shapes that are expected to print on the wafer. Data 1020 can include constants, empirical data, kernel identifiers, and any other information that may be required to calibrate and/or use the CAR model.

Figure 11:
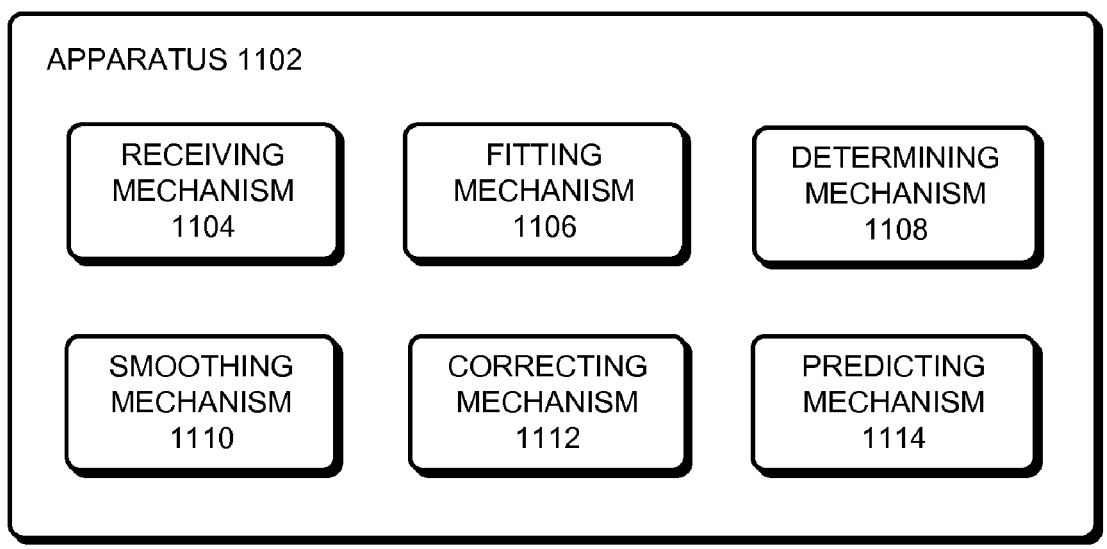
FIG. 11 illustrates an apparatus in accordance with an embodiment of the present invention.

FIG. 11 illustrates an apparatus in accordance with an embodiment of the present invention.

Apparatus 1102 can comprise a number of mechanisms which may communicate with one another via a wired or wireless communication channel. Apparatus 1102 may be realized using one or more integrated circuits, and it may be integrated in a computer system, or it may be realized as a separate device which is capable of communicating with other computer systems and/or devices. Specifically, apparatus 1102 can comprise receiving mechanism 1104, fitting mechanism 1106, determining mechanism 1108, smoothing mechanism 1110, correcting mechanism 1112, and predicting mechanism 1114.

In some embodiments, receiving mechanism 1104 may be configured to receive layouts, empirical data, and/or quenching models, fitting mechanism 1106 may be configured to fit one or more uncalibrated quenching models and one or more uncalibrated smoothing kernels to empirical data, determining mechanism 1108 may be configured to apply calibrated quenching models which are associated with different acid concentration ranges to the initial acid profile, smoothing mechanism 1110 may be configured to apply a calibrated smoothing kernel to a quenched acid profile to obtain a quenched-and-diffused acid profile, correcting mechanism 1112 may be configured to correct a layout by using the quenched-and-diffused acid profile, and predicting mechanism 1114 may be configured to predict shapes on the wafer based on the quenched-and-diffused acid profile.

Specifically, predicting mechanism 1114 can compare the quenched-and-diffused acid profile with a threshold to determine contours of shapes that are expected to print on the wafer. Correcting mechanism 1112 can correct a shape in a layout if the shape that is expected to be printed on the wafer does not match the design intent.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for modeling chemically amplified resist, the method comprising:

determining a quenched acid profile from an initial acid profile by applying multiple quenching models which are associated with different acid concentration ranges to the initial acid profile; and applying, by using a computer, a smoothing kernel to the quenched acid profile to obtain a quenched-and-diffused acid profile.

2. The method of claim 1, wherein the method further comprises using the quenched-and-diffused acid profile to predict shapes and sizes of features that are expected to be printed on a wafer.

3. The method of claim 1, wherein the method further comprises using the quenched-and-diffused acid profile to determine proximity corrections to improve manufacturability of a layout.

4. The method of claim 1, wherein the smoothing kernel is a two-dimensional Gaussian kernel.

5. The method of claim 1, wherein the smoothing kernel is a two-dimensional Epanechnikov kernel.

6. The method of claim 1, wherein at least one quenching model in the multiple quenching models is expressible as $H=H_0-B_0$, wherein H is an acid profile after quenching, $H_0$ is an acid profile before quenching, and $B_0$ is an initial base quencher profile.

7. The method of claim 1, wherein at least one quenching model in the multiple quenching models is expressible as $H=k \cdot H_0$, wherein H is an acid profile after quenching, $H_0$ is an acid profile before quenching, and k is a constant.

8. A computer-readable storage device storing instructions that when executed by a computer cause the computer to perform a method for modeling chemically amplified resist, the method comprising:

determining a quenched acid profile from an initial acid profile by applying multiple quenching models which are associated with different acid concentration ranges to the initial acid profile; and applying a smoothing kernel to the quenched acid profile to obtain a quenched-and-diffused acid profile.

9. The computer-readable storage device of claim 8, wherein the method further comprises using the quenched-and-diffused acid profile to predict shapes and sizes of features that are expected to be printed on a wafer.

10. The computer-readable storage device of claim 8, wherein the method further comprises using the quenched-and-diffused acid profile to determine proximity corrections to improve manufacturability of a layout.

11. The computer-readable storage device of claim 8, wherein the smoothing kernel is a two-dimensional Gaussian kernel.

12. The computer-readable storage device of claim 8, wherein the smoothing kernel is a two-dimensional Epanechnikov kernel.

13. The computer-readable storage device of claim 8, wherein at least one quenching model in the multiple quenching models is expressible as $H=H_0-B_0$, wherein H is an acid profile after quenching, $H_0$ is an acid profile before quenching, and $B_0$ is an initial base quencher profile.

14. The computer-readable storage device of claim 8, wherein at least one quenching model in the multiple quenching models is expressible as $H=k \cdot H_0$, wherein H is an acid profile after quenching, $H_0$ is an acid profile before quenching, and k is a constant.

15. An apparatus for modeling chemically amplified resist, the apparatus comprising:

a determining mechanism configured to determine a quenched acid profile from an initial acid profile by applying multiple quenching models which are associated with different acid concentration ranges to the initial acid profile; and a smoothing mechanism configured to apply a smoothing kernel to the quenched acid profile to obtain a quenched-and-diffused acid profile.

16. The apparatus of claim 15, wherein the apparatus further comprises a predicting mechanism configured to use the quenched-and-diffused acid profile to predict shapes and sizes of features that are expected to be printed on a wafer.

17. The apparatus of claim 15, wherein the apparatus further comprises a correcting mechanism configured to use the quenched-and-diffused acid profile to determine proximity corrections to improve manufacturability of a layout.

18. The apparatus of claim 15, wherein the smoothing kernel is a two-dimensional Gaussian kernel.

19. The apparatus of claim 15, wherein the smoothing kernel is a two-dimensional Epanechnikov kernel.

20. The apparatus of claim 15, wherein at least one quenching model in the multiple quenching models is expressible as $H=H_0-B_0$, wherein H is an acid profile after quenching, $H_0$ is an acid profile before quenching, and $B_0$ is an initial base quencher profile.

21. The apparatus of claim 15, wherein at least one quenching model in the multiple quenching models is expressible as $H=k-H_0$, wherein H is an acid profile after quenching, $H_0$ is an acid profile before quenching, and k is a constant.

* * * * *